(12) United States Patent
Kobayashi et al.

(10) Patent No.: US 7,556,975 B2
(45) Date of Patent: Jul. 7, 2009

(54) METHOD FOR MANUFACTURING BACKSIDE-ILLUMINATED OPTICAL SENSOR

(75) Inventors: Hiroya Kobayashi, Hamamatsu (JP); Hiroshi Akahori, Hamamatsu (JP); Masaharu Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 245 days.

(21) Appl. No.: 10/553,231

(22) PCT Filed: Apr. 14, 2004

(86) PCT No.: PCT/JP2004/005333

§ 371 (c)(1),
(2), (4) Date: May 7, 2007

(87) PCT Pub. No.: WO2004/093195

PCT Pub. Date: Oct. 28, 2004

(65) Prior Publication Data

US 2007/0275488 A1 Nov. 29, 2007

(30) Foreign Application Priority Data

Apr. 16, 2003 (JP) .............................. 2003-112047

(51) Int. Cl.
*H01L 21/02* (2006.01)
(52) U.S. Cl. .............................. 438/26; 438/27; 438/33
(58) Field of Classification Search .................. 438/26, 438/27, 33, 458, 459
See application file for complete search history.

(56) References Cited

U.S. PATENT DOCUMENTS

| | | | |
|---|---|---|---|
| 6,661,084 B1 * | 12/2003 | Peterson et al. | 257/680 |
| 6,703,598 B2 * | 3/2004 | Muramatsu et al. | 250/214.1 |
| 2001/0009300 A1 * | 7/2001 | Sugimura | 257/693 |

FOREIGN PATENT DOCUMENTS

| | | |
|---|---|---|
| JP | 64-007561 | 1/1989 |
| JP | 06-243795 | 9/1994 |
| JP | 06-268243 | 9/1994 |
| JP | 06-318688 | 11/1994 |
| JP | 06-318689 | 11/1994 |

(Continued)

*Primary Examiner*—Alexander G Ghyka
(74) *Attorney, Agent, or Firm*—Drinker Biddle & Reath LLP

(57) ABSTRACT

A CCD portion 3 is formed on a front surface side of a semiconductor substrate 1. A region of a back surface side of semiconductor substrate 1 that corresponds to CCD portion 3 is thinned while leaving peripheral regions 1a of the region, and an accumulation layer 5 is formed on the back surface side of semiconductor substrate 1. An electrical wiring 7, which is electrically connected to CCD portion 3, and an electrode pad 9, which is electrically connected to electrical wiring 7, are then formed on a region 1b of the front surface side of semiconductor substrate 1 that corresponds to a peripheral region 1a, and a supporting substrate 11 is adhered onto the front surface side of semiconductor substrate 1 so as to cover CCD portion 3 while leaving electrode pad 9 exposed. Semiconductor substrate 1 and supporting substrate 11 are then cut at a thinned portion of semiconductor substrate 1 so as to leave peripheral region 1a corresponding to region 1b at which electrical wiring 7 and electrode pad 9 are formed.

6 Claims, 9 Drawing Sheets

FOREIGN PATENT DOCUMENTS

| | | |
|---|---|---|
| JP | 06-318690 | 11/1994 |
| JP | 06-334158 | 12/1994 |
| JP | 07-245386 | 9/1995 |
| JP | 08-241977 | 9/1996 |
| JP | 09-082852 | 3/1997 |
| JP | 10-116974 | 5/1998 |
| JP | 11-330327 | 11/1999 |
| JP | 1 152 448 A1 | 11/2001 |

* cited by examiner

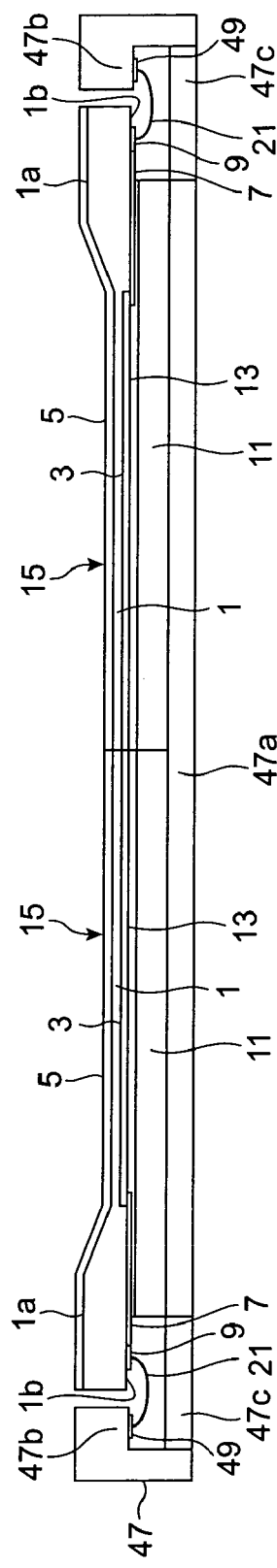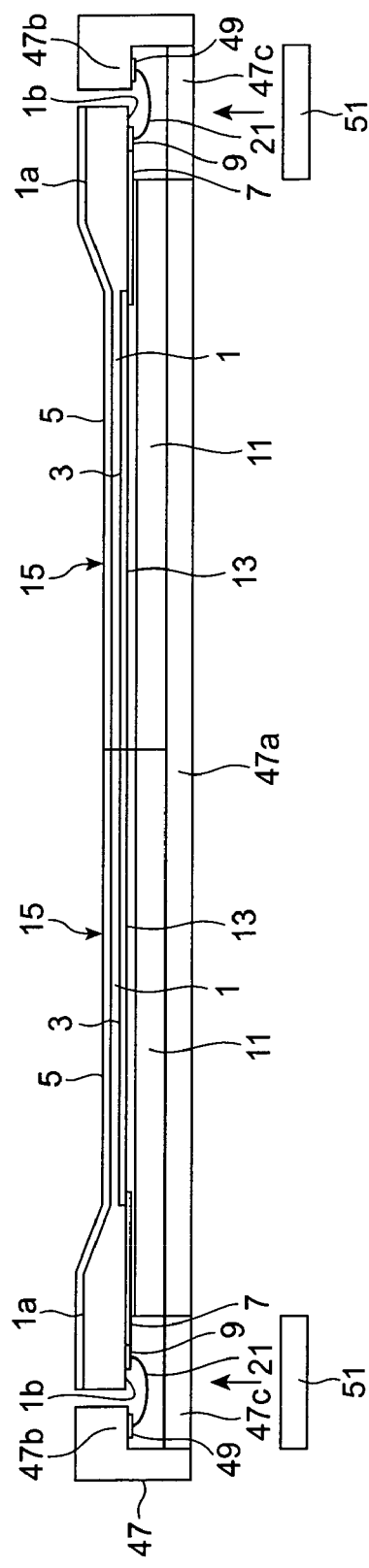

METHOD FOR MANUFACTURING BACKSIDE-ILLUMINATED OPTICAL SENSOR

TECHNICAL FIELD

The present invention relates to a method for manufacturing a back-illuminated photodetector device.

BACKGROUND ART

A known method for manufacturing a back-illuminated photodetector comprises the steps of: forming a charge reading portion at one surface side of a semiconductor substrate; attaching a reinforcing member to the one surface side of the semiconductor substrate; thinning the semiconductor substrate from the other surface side; forming an accumulation layer at the other surface side of the semiconductor substrate; removing the semiconductor substrate constituent material at portions besides the charge reading portion forming region and regions in the proximity of the charge reading portion; and forming an aluminum wiring that is electrically connected to the charge reading portion (see, for example, Patent Document 1).

In the above-mentioned Patent Document 1, in the step of forming the wiring, a contact hole is formed in a field oxide film that is exposed in the step of removing the semiconductor substrate constituent material and the aluminum wiring is disposed in the contact holes and on the region at which the field oxide film is exposed.

[Patent Document 1] Japanese Published Unexamined Patent Application No. Hei 10-116974

DISCLOSURE OF THE INVENTION

However, the above-described conventional art requires the step of removing the semiconductor substrate constituent material and the step of forming the aluminum wiring, which requires the forming of a contact hole. The manufacturing process is thus made complicated and the manufacturing cost is made high.

Also, with the above-described conventional art, since a step is formed between the surface of the charge reading portion forming region and the surface (exposed surface of the field oxide film) on which the aluminum wiring is formed, the fine-forming of the contact hole and the aluminum wiring is made difficult by the problem of focal depth in the exposure technique. In such a case where it is difficult to make the aluminum wiring fine, when a plurality of back-illuminated photodetectors are positioned adjacently in a so-called a buttable configuration, the dead area that is used just for the wirings (the region besides the photodetecting portions) becomes large.

The present invention has been made in view of the above point and an object thereof is to provide a back-illuminated photodetector manufacturing method by which the manufacturing process is simplified and the manufacturing cost can be reduced.

In order to achieve the above object, a back-illuminated photodetector manufacturing method according to the present invention comprises the steps of: forming a charge reading portion at one surface side of a semiconductor substrate; thinning a region of the other surface side of the semiconductor substrate that corresponds to the charge reading portion while leaving regions peripheral to the region; forming an accumulation layer at the other surface side of the semiconductor substrate; forming, at a region of the one surface side of the semiconductor substrate corresponding to a peripheral region, an electrical wiring, electrically connected to the charge reading portion, and an electrode pad, electrically connected to the electrical wiring; adhering a supporting substrate on the one surface side of the semiconductor substrate so as to cover the charge reading portion while leaving the electrode pad exposed; and cutting the semiconductor substrate and the supporting substrate at a thinned portion of the semiconductor substrate so as to leave the peripheral region corresponding to the region at which the electrical wiring and the electrode pad are formed.

In the back-illuminated photodetector manufacturing method according to the present invention, the region of the other surface side of the semiconductor substrate that corresponds to the charge reading portion is thinned, and after forming the accumulation layer at the other surface side, the electrode wiring and the electrode pad are formed at a region of the one surface side of the semiconductor substrate that corresponds to a peripheral region, the supporting substrate is adhered onto the one surface side of the semiconductor substrate so as to cover the charge reading portion while keeping the electrode pad exposed, and the semiconductor substrate and the supporting substrate are cut at the thinned portion of the semiconductor substrate so as to leave the peripheral region corresponding to the region at which the electrical wiring and the electrode pad are formed. The step of removing the semiconductor substrate forming material and the step of forming the contact hole, which were required in the conventional art, are thus made unnecessary. As a result, the manufacturing process is simplified and the manufacturing cost can be reduced. Also, since the electrode wiring and the electrode pad are formed on one surface of the semiconductor substrate, the problem related to focal depth does not occur. The electrode wiring and the electrode pad can thus be made fine readily.

Thus by the back-illuminated photodetector manufacturing method according to the present invention, a back-illuminated photodetector manufacturing method, with which the manufacturing process is simplified and the manufacturing cost can be reduced, can be provided.

Preferably, the steps of: preparing a package having an electrode pad; and mounting the semiconductor substrate and the supporting substrate, which have been cut at the thinned portion of the semiconductor substrate onto the package; are furthermore provided, and the step of mounting onto the package preferably comprises the steps of: adhering the peripheral region corresponding to the region at which the electrical wiring and the electrode pad are formed, onto the package; electrically connecting the electrode pad of the package and the electrode pad formed on the semiconductor substrate by a bonding wire; and adhering a protective plate onto the supporting substrate and the package so as to cover the bonding wire and both electrode pads. In this case, the semiconductor substrate and the supporting substrate, which have been cut at the portion where the semiconductor substrate is thinned, can be mounted appropriately onto the package.

Also, preferably the steps of: preparing a package having an electrode pad and having an opening formed at a position corresponding to the electrode pad; and mounting the semiconductor substrate and the supporting substrate, which have been cut at the thinned portion of the semiconductor substrate onto the package; are furthermore provided, and the step of mounting onto the package preferably comprises the steps of: adhering the supporting substrate onto the package to fix the semiconductor substrate and the supporting substrate, which have been cut at the thinned portion of the semiconductor substrate onto the package; electrically connecting the electrode pad of the package and the electrode pad formed on the semiconductor substrate by a bonding wire from the opening; and adhering a protective plate onto the package so as to close off the opening. In this case, the semiconductor substrate and the supporting substrate, which have been cut at the portion where the semiconductor substrate is thinned, can be mounted appropriately onto the package.

Also, the step of positioning a plurality of the packages, onto each of which the semiconductor substrate and the supporting substrate have been mounted, so that the thinned portions of the semiconductor substrates are positioned adjacent each other is preferably provided after the step of mounting onto the package. In this case, the area of the photodetecting portions (charge reading portions) of the back-illuminated photodetector can be made large readily. Since the electrode wirings and the electrode pads can be made fine as described above, the dead area that does not contribute to photodetecting will not become large.

Also preferably, the steps of preparing a package having electrode pads; and mounting a plurality of the semiconductor substrates and the supporting substrates, which have been cut at the thinned portions of the semiconductor substrates, onto the package; are furthermore provided, and the step of plural mounting onto the package preferably comprises the steps of: positioning the plurality of the semiconductor substrates and the supporting substrates, which have been cut at the thinned portions of the semiconductor substrates, so that the thinned portions of the semiconductor substrates are positioned adjacent each other and adhering the peripheral regions, corresponding to the regions at which the electrical wirings and the electrode pads are formed, respectively onto the package; electrically connecting the electrode pads of the package and the electrode pads, formed on the semiconductor substrates, by bonding wires; and adhering a protective plate onto the supporting substrates and the package so as to cover the bonding wires and both electrode pads. In this case, the plurality of the semiconductor substrates and the supporting substrates, which have been cut at the thinned portions of the semiconductor substrates, can be mounted appropriately onto the package. Also, the area of the photodetecting portions (charge reading portions) of the back-illuminated photodetector can be made large readily. Since the electrode wirings and the electrode pads can be made fine as described above, the dead area that does not contribute to photodetecting will not become large.

Also, preferably, the steps of: preparing a package having electrode pads and having openings formed at positions corresponding to the electrode pads; and mounting a plurality of the semiconductor substrates and the supporting substrates, which have been cut at the thinned portions of the semiconductor substrates, onto the package; are furthermore provided, and the step of plural mounting onto the package preferably comprises the steps of: positioning the plurality of the semiconductor substrates and the supporting substrates, which have been cut at the thinned portions of the semiconductor substrates, so that the thinned portions of the semiconductor substrates are positioned adjacent each other and adhering the supporting substrates respectively onto the package; electrically connecting the electrode pads of the package and the electrode pads, formed on the semiconductor substrates, by bonding wires from the openings; and adhering a protective plate onto the package so as to close off the openings. In this case, the plurality of the semiconductor substrates and the supporting substrates, which have been cut at the thinned portions of the semiconductor substrates, can be mounted appropriately onto the package. Also, the area of the photodetecting portions (charge reading portions) of the back-illuminated photodetector can be made large readily. Since the electrode wirings and the electrode pads can be made fine as described above, the dead area that does not contribute to photodetecting will not become large.

BRIEF DESCRIPTION OF THE DRAWINGS

FIGS. 8A and 8B are schematic views for describing a back-illuminated photodetector manufacturing method for a fourth embodiment.

BEST MODES FOR CARRYING OUT THE INVENTION

Back-illuminated photodetector manufacturing methods of embodiments of the invention shall now be described with reference to the drawings. The same symbols shall be used for elements that are the same or elements having the same functions and redundant description shall be omitted.

FIRST EMBODIMENT

FIGS. 1A to 1F and 2A to 2D are schematic diagrams for describing a back-illuminated photodetector manufacturing method for a first embodiment and show the longitudinal sectional structure of a back-illuminated photodetector. FIG. 3 is a schematic diagram for describing the back-illuminated photodetector manufacturing method for the first embodiment and is a perspective view that includes a longitudinal section of the back-illuminated photodetector. A detailed description shall follow.

In the manufacturing method for the first embodiment, the following processes (1) through (10) are executed successively.

Process (1)

First, a semiconductor substrate 1, formed of Si, is prepared. A CCD portion 3 is then formed as a charge reading portion on a front surface side (one surface side) of semiconductor substrate 1 (see FIG. 1A). CCD portion 3 has formed therein a potential well, which accumulates charges generated in a photosensitive region of the semiconductor substrate, and includes a transfer electrode for transferring charges, etc. In plan view, CCD portion 3 exhibits a rectangular shape (of a size, for example, of approximately 30 mm×60 mm).

Process (2)

Figure 1A:
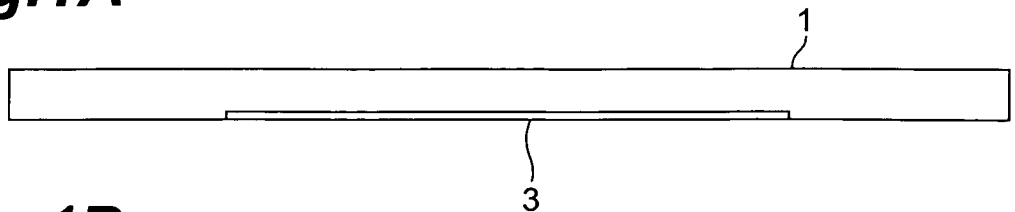
FIGS. 1A to 1F are schematic views for describing a back-illuminated photodetector manufacturing method for a first embodiment.
Figure 1B:
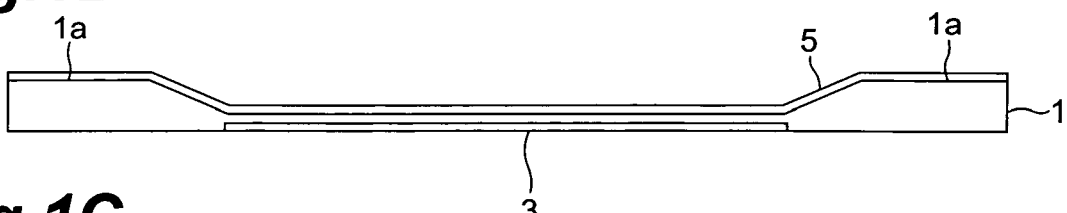

A region of a back surface side (other surface side) of semiconductor substrate 1 that corresponds to CCD portion 3 is then thinned while leaving peripheral regions 1a of the region (see FIG. 1B). The thinning of semiconductor substrate 1 is carried out by forming a mask having an opening above the region corresponding to CCD portion 3 and etching the back surface of semiconductor substrate 1 using the mask. The mask may be formed by a photolithography technique. Isotropic wet etching may be employed for the etching. $HF/HNO_3$, etc., may be used as the etching solution. Also, atmospheric downstream plasma (ADP) etching or other form of isotropic dry etching may be employed instead. Anisotropic wet etching may also be employed, and as the etching solution in this case, KOH, ethylenediamine, etc., may be used. The etching is performed until the thickness of the thinned portion of semiconductor substrate 1 becomes 20 to 50 µm. The portions (thick portions) of semiconductor substrate 1 that are not etched function as frame portions for securing the mechanical strength of the thinned portion.

Here, it should be noted that "back surface" refers to the light-incident surface of the back-illuminated photodetector that is manufactured in the final stage and is thus a term that is used for convenience of description and does not refer to the surface at the lower side in the drawings. The "front surface" is the surface at the opposite side of the back surface.

Process (3)

An accumulation layer 5 is formed on the back surface side of semiconductor substrate 1 (see FIG. 1B). Accumulation layer 5 is formed by forming a thermal oxide film on the back surface of semiconductor substrate 1, with which the region corresponding to CCD portion 3 has been thinned, and activating the injected ion after performing ion injection from the back surface side. The forming of the thermal oxide film and activation may be carried out by subjecting semiconductor substrate 1 to a high-temperature heating process (of, for example, approximately 900° C.).

Process (4)

Figure 1C:
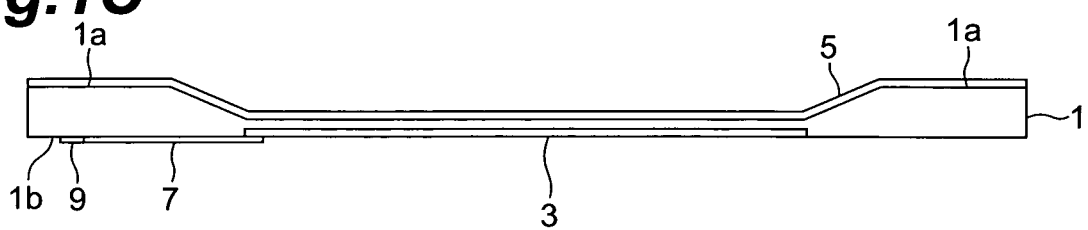

An electrical wiring 7, which is electrically connected to CCD portion 3, and an electrode pad 9, which is electrically connected to electrical wiring 7, are then formed at a region 1b of the front surface side of semiconductor substrate 1 that corresponds to a peripheral region 1a (see FIG. 1C). Electrical wiring 7 and electrode pad 9 may be formed by vapor depositing a conductive metal (for example, aluminum, gold, silver, etc.,) onto the front surface side of semiconductor substrate 1 and thereafter removing the conductive metal by etching using a mask having an opening of predetermined shape, etc. A plating method may be employed to form electrical wiring 7 and electrode pad 9.

Process (5)

Figure 1D:
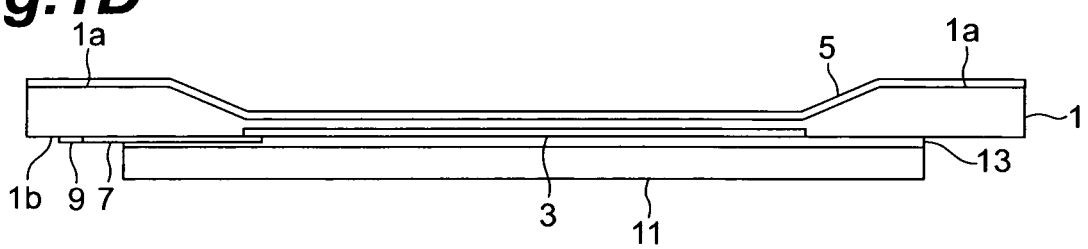

Next, a supporting substrate 11 is adhered onto the front surface side of semiconductor substrate 1 so as to cover CCD portion 3 while leaving electrode pad 9 exposed (see FIG. 1D). Supporting substrate 11 is adhered by attaching to semiconductor substrate 1 using, for example, a resin (for example, an epoxy resin) 13. As the material of supporting substrate 11, Si, sapphire, ceramic, etc., may be used. Though, from the standpoint of securing mechanical strength, the area of supporting substrate 11 is preferably set so that end portions thereof extend up to portions of semiconductor substrate 1 that are not etched, the area is not restricted to such.

Process (6)

Figure 1E:
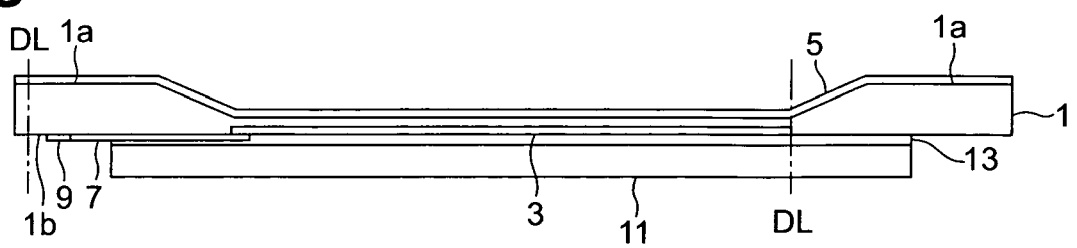
Figure 1F:
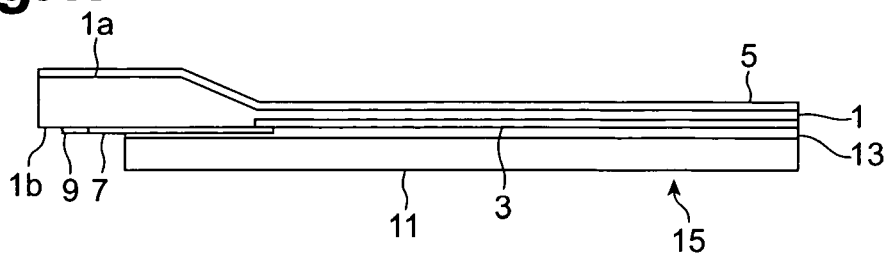

Next, semiconductor substrate 1 and supporting substrate 11 are cut at a thinned portion of semiconductor substrate 1 so as to leave peripheral region 1a, which corresponds to region 1b at which electrical wiring 7 and electrode pad 9 are formed (see FIGS. 1E and 1F). A CCD chip 15, which includes semiconductor substrate 1 and supporting substrate 11 that are cut at the thinned portion of semiconductor substrate 1, is thereby completed. A dicing technique may be used to cut semiconductor substrate 1 and supporting substrate 11, and in this case, dicing lines DL, which extend along three of the four sides of CCD portion 3 (and of which just one is shown in FIG. 1E), are set. With the present embodiment, an end portion of region 1b (a portion that is not etched), at which electrical wiring 7 and electrode pad 9 are formed, is also cut.

Process (7)

First, a package 17, onto which CCD chip 15 is to be mounted, is prepared. The package 17 has a CCD chip mounting portion 17a and a step portion 17b and has an electrode pad 19 at step portion 17b. Ceramic, etc., may be used as the material of package 17.

The upper and lower sides of CCD chip 15 are then inverted so that the back surface side of semiconductor substrate 1 is positioned at the CCD chip mounting portion 17a side. Peripheral region 1a corresponding to region 1b at which electrical wiring 7 and electrode pad 9 are formed, is then adhered onto CCD chip mounting portion 17a of package 17 and CCD chip 15 is thereby fixed to package 17 (see FIGS. 2A and 2B). The adhesion of semiconductor substrate 1 and package 17 may be performed by die bonding using a resin (for example, an epoxy-based resin, etc.).

Process (8)

Figure 2A:
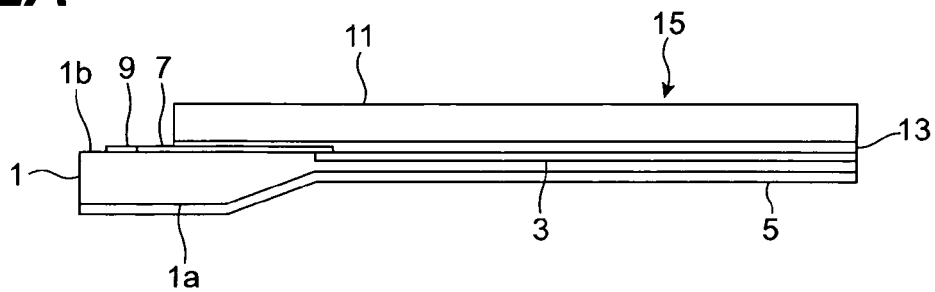
FIGS. 2A to 2D are schematic views for describing the back-illuminated photodetector manufacturing method for the first embodiment.
Figure 2B:
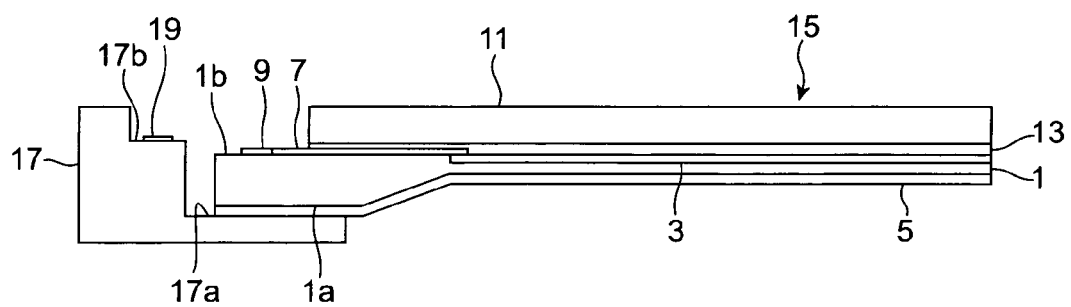
Figure 2C:
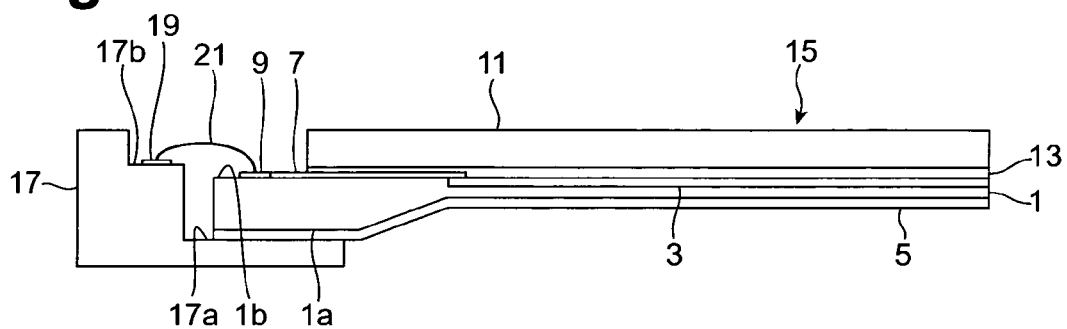
Figure 3:
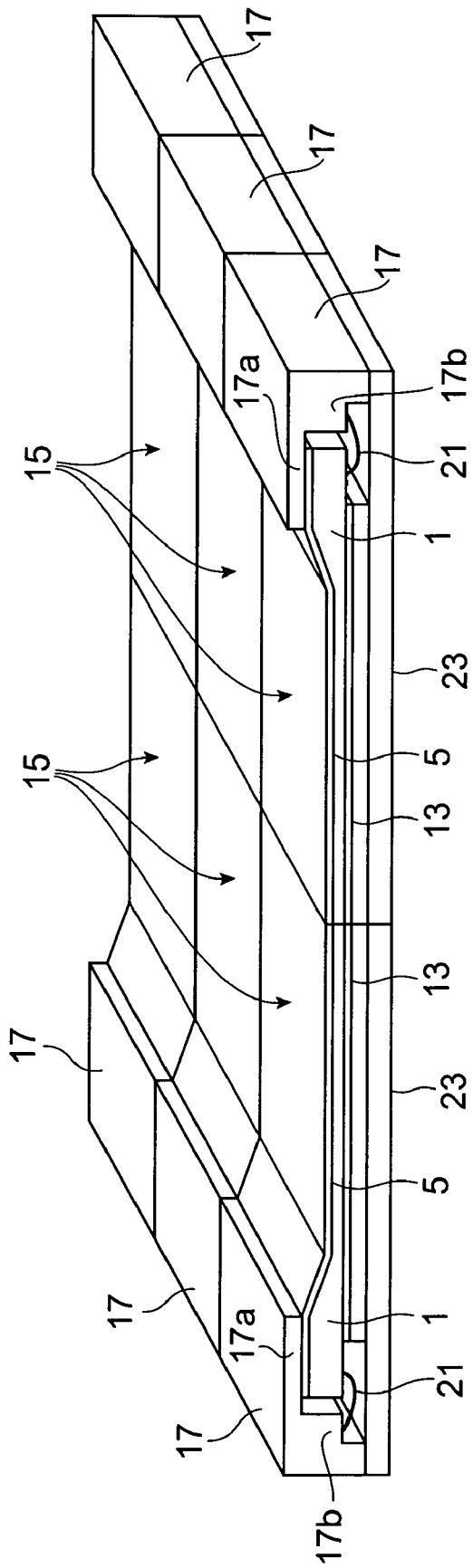
FIG. 3 is a schematic view for describing the back-illuminated photodetector manufacturing method for the first embodiment.

Electrode pad 19 of package 17 and electrode pad 9 formed on semiconductor substrate 1, are then electrically connected by a bonding wire 21 (see FIG. 2C). As bonding wire 21, an Au wire, etc., may be used.

Process (9)

Figure 2D:
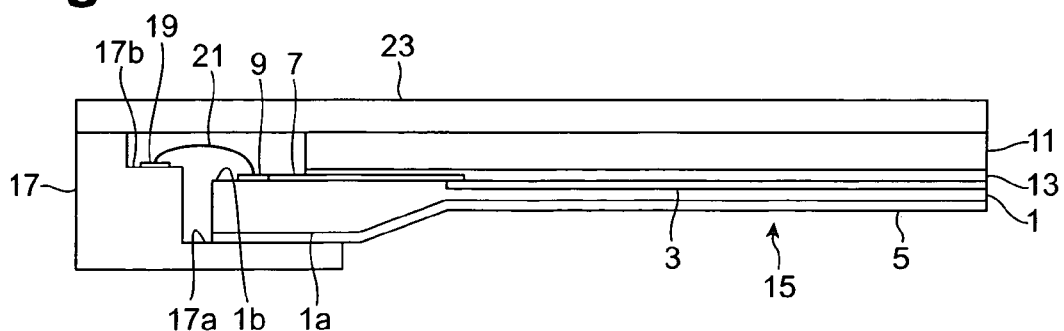

A protective plate 23 is then adhered onto supporting substrate 11 and package 17 so as to cover bonding wire 21 and both electrode pads 9 and 19 (see FIG. 2D). Protective plate 23 is adhered by attaching to supporting substrate 11 and package 17 using a resin (for example, an epoxy resin, etc.). In this process, adhesion is performed with the end faces of supporting substrate 11 and protective plate 23 being matched at the side opposite package 17 (the right side in FIG. 2D). CCD chip 15 is thereby mounted onto package 17.

Process (10)

CCD chips 15 mounted on packages 17, are then put in a buttable configuration (FIG. 3). The buttable configuration is formed by positioning a plurality of packages 17, onto which CCD chips 15 are mounted, so that the thinned portions of semiconductor substrates 1 are positioned adjacent each other, that is, so that the cut surfaces of semiconductor substrates 1 and supporting substrates 11 abut each other.

As has been described above, with the manufacturing method for the first embodiment, the region of the back surface side of semiconductor substrate 1 that corresponds to CCD portion 3 is thinned, and after forming accumulation layer 5 at the back surface side, electrode wiring 7 and electrode pad 9 are formed at region 1b of the front surface side of semiconductor substrate 1 that corresponds to peripheral region 1a, supporting substrate 11 is adhered onto the front surface side of semiconductor substrate 1 so as to cover CCD portion 3 while keeping electrode pad 9 exposed, and semiconductor substrate 1 and supporting substrate 11 are cut at a thinned portion of semiconductor substrate 1 so as to leave peripheral region 1a corresponding to region 1b at which electrical wiring 7 and the electrode pad 9 are formed. The process of removing the semiconductor substrate forming material and the process of forming a contact hole, which were required in the conventional art, are thus made unnecessary. As a result, the manufacturing process is simplified and the manufacturing cost can be reduced. Also, since electrode wiring 7 and electrode pad 9 are formed on the front surface of semiconductor substrate 1, the problem related to focal depth does not occur. Electrode wiring 7 and electrode pad 9 can thus be made fine readily.

The manufacturing method for the first embodiment furthermore has the processes of: preparing package 17, having electrode pad 19; and mounting CCD chip 15 onto package 17; and the process of mounting onto package 17 comprises the processes of: adhering peripheral region 1a corresponding to region 1b at which electrical wiring 7 and electrode pad 9 are formed onto CCD chip mounting portion 17a of package 17; electrically connecting electrode pad 19 of package 17 and electrode pad 9 formed on semiconductor substrate 1 by bonding wire 21; and adhering protective plate 23 onto supporting substrate 11 and package 17 so as to cover bonding wire 21 and both electrode pads 9 and 19. CCD chip 15 can thereby be mounted appropriately onto package 17.

Also with the manufacturing method for the first embodiment, the process of positioning a plurality of packages 17 onto each of which CCD chip 15 has been mounted, so that the thinned portions of semiconductor substrates 1 are positioned adjacent each other is provided after the process of mounting CCD chip 15 onto package 17. The area of the photodetecting portions (CCD portions 3) of the back-illuminated photodetector can thereby be made large readily. Since electrode wirings 7 and electrode pads 9 can be made fine as described above, the dead area that does not contribute to photodetecting will not become large.

SECOND EMBODIMENT

Figure 4A:
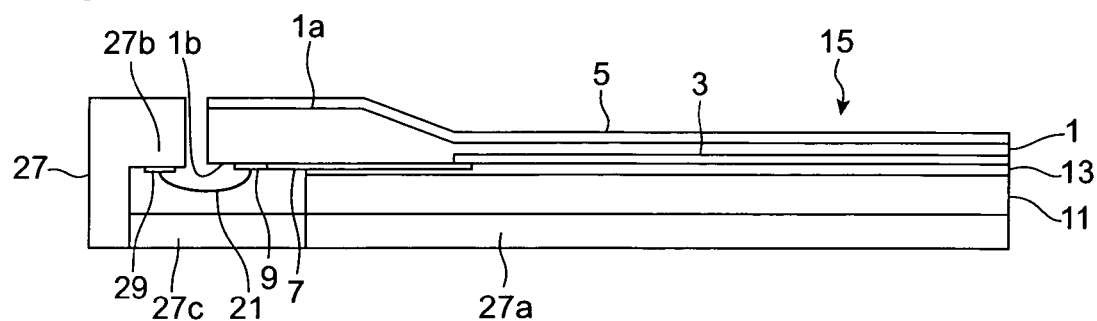
FIGS. 4A and 4B are schematic views for describing a back-illuminated photodetector manufacturing method for a second embodiment.
Figure 4B:
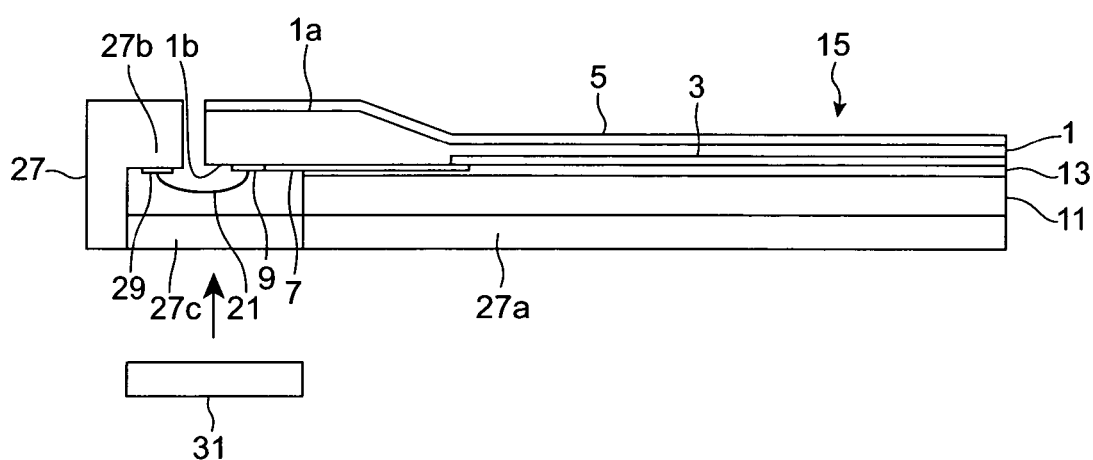
Figure 5:
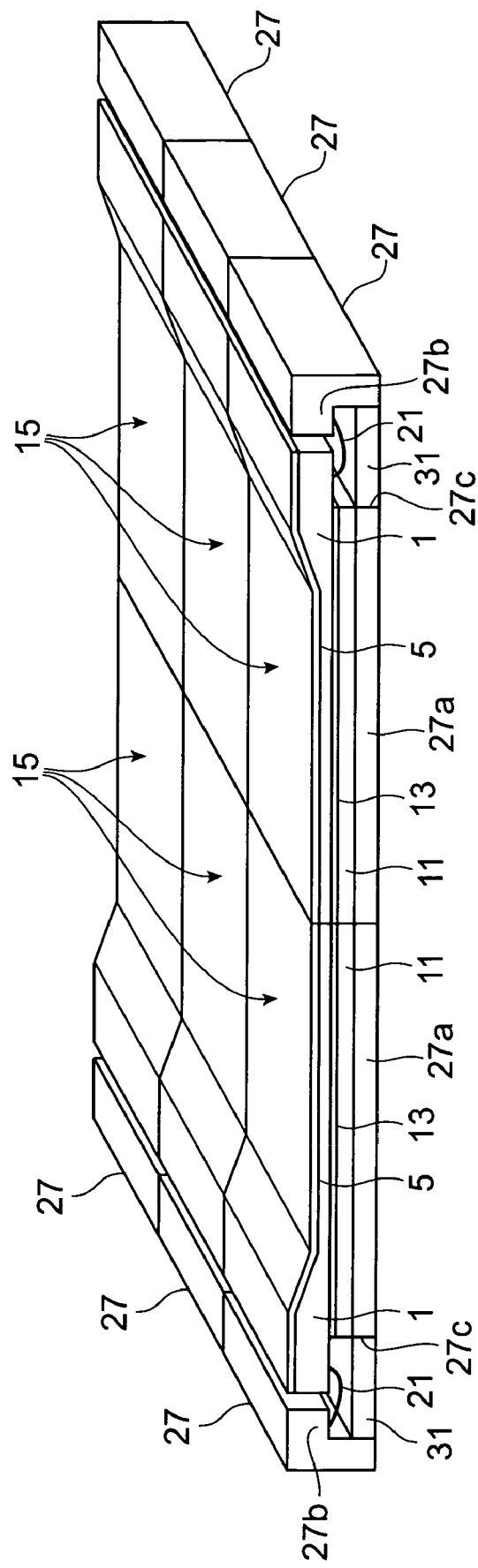
FIG. 5 is a schematic view for describing the back-illuminated photodetector manufacturing method for the second embodiment.

FIGS. 4A and 4B are schematic diagrams for describing a back-illuminated photodetector manufacturing method for a second embodiment and show the longitudinal sectional structure of a back-illuminated photodetector. FIG. 5 is a schematic diagram for describing the back-illuminated photodetector manufacturing method for the second embodiment and is a perspective view that includes a longitudinal section of the back-illuminated photodetector. A detailed description shall follow.

In the manufacturing method for the second embodiment, the following processes (1) through (10) are executed successively. However, processes (1) through (6) are the same as processes (1) through (6) of the above-described first embodiment and thus description thereof shall be omitted.

Process (7)

First, a package 27, onto which CCD chip 15 is to be mounted, is prepared. The package 27 comprises a CCD chip mounting portion 27a and a protruding portion 27b, which is formed so as to oppose CCD chip mounting portion 27a, and has an electrode pad 29 on the surface of protruding portion 27b that opposes CCD chip mounting portion 27a. An opening 27c is formed at a position of CCD chip mounting portion 27a that opposes protruding portion 27b (electrode pad 29. Ceramic, etc., may be used as the material of package 27.

CCD chip 15 is then positioned so that the front surface side of semiconductor substrate 1, that is, supporting substrate 11 is positioned at the CCD chip mounting portion 27a side. Supporting substrate 11 is then adhered onto CCD chip mounting portion 27a of package 27 and CCD chip 15 is thereby fixed to package 27 (see FIG. 4A). In this process, adhesion is carried out with the end faces of supporting substrate 11 and CCD chip mounting portion 27a being matched at the opposite side (right side in FIG. 4A) of package 27. The adhesion of supporting substrate 11 and package 27 may be performed by die bonding using a resin (for example, an epoxy-based resin, etc.).

Process (8)

Electrode pad 29 of package 27 and electrode pad 9 formed on semiconductor substrate 1, are then electrically connected by bonding wire 21 from opening 27c (see FIG. 4A).

Process (9)

A protective plate 31 is then adhered onto CCD chip mounting portion 27a of package 27 so as to close off opening 27c (see FIG. 4B). Protective plate 31 is adhered by attaching to package 27 using a resin (for example, an epoxy resin, etc.). CCD chip 15 is thereby mounted on package 27.

Process (10)

CCD chips 15 mounted on packages 27 are then positioned in a buttable configuration (FIG. 5). The buttable configuration is formed by positioning a plurality of packages 27, onto which CCD chips 15 are mounted, so that the thinned portions of semiconductor substrates 1 are positioned adjacent each other, that is, so that the cut surfaces of semiconductor substrates 1 and supporting substrates 11 abut each other.

As described above, with the manufacturing method for the second embodiment, the manufacturing process is simplified and the manufacturing cost can be reduced as with the manufacturing method for the first embodiment. Also, electrical wirings 7 and electrode pads 9 can be made fine readily.

The manufacturing method for the second embodiment furthermore has the processes of: preparing package 27, having electrode pad 29 and having opening 27c formed at a position corresponding to electrode pad 29; and mounting CCD chip 15 onto package 27; and the process of mounting onto package 27 comprises the processes of: adhering supporting substrate 11 onto package 27 to fix CCD chip 15 onto package 27; electrically connecting electrode pad 29 of package 27 and electrode pad 9 formed on semiconductor substrate 1 by bonding wire 21 from opening 27c; and adhering protective plate 31 onto package 27 so as to close off opening 27c. CCD chip 15 can thereby be mounted appropriately onto package 27.

Also with the manufacturing method for the second embodiment, the process of positioning a plurality of packages 27, onto each of which CCD chip 15 has been mounted, so that the thinned portions of semiconductor substrates 1 are positioned adjacent each other is provided after the process of mounting CCD chip 15 onto package 27. The area of the photodetecting portions (CCD portions 3) of the back-illuminated photodetector can thereby be made large readily. Since electrode wirings 7 and electrode pads 9 can be made fine as described above, the dead area that does not contribute to photodetecting will not become large.

THIRD EMBODIMENT

Figure 6:
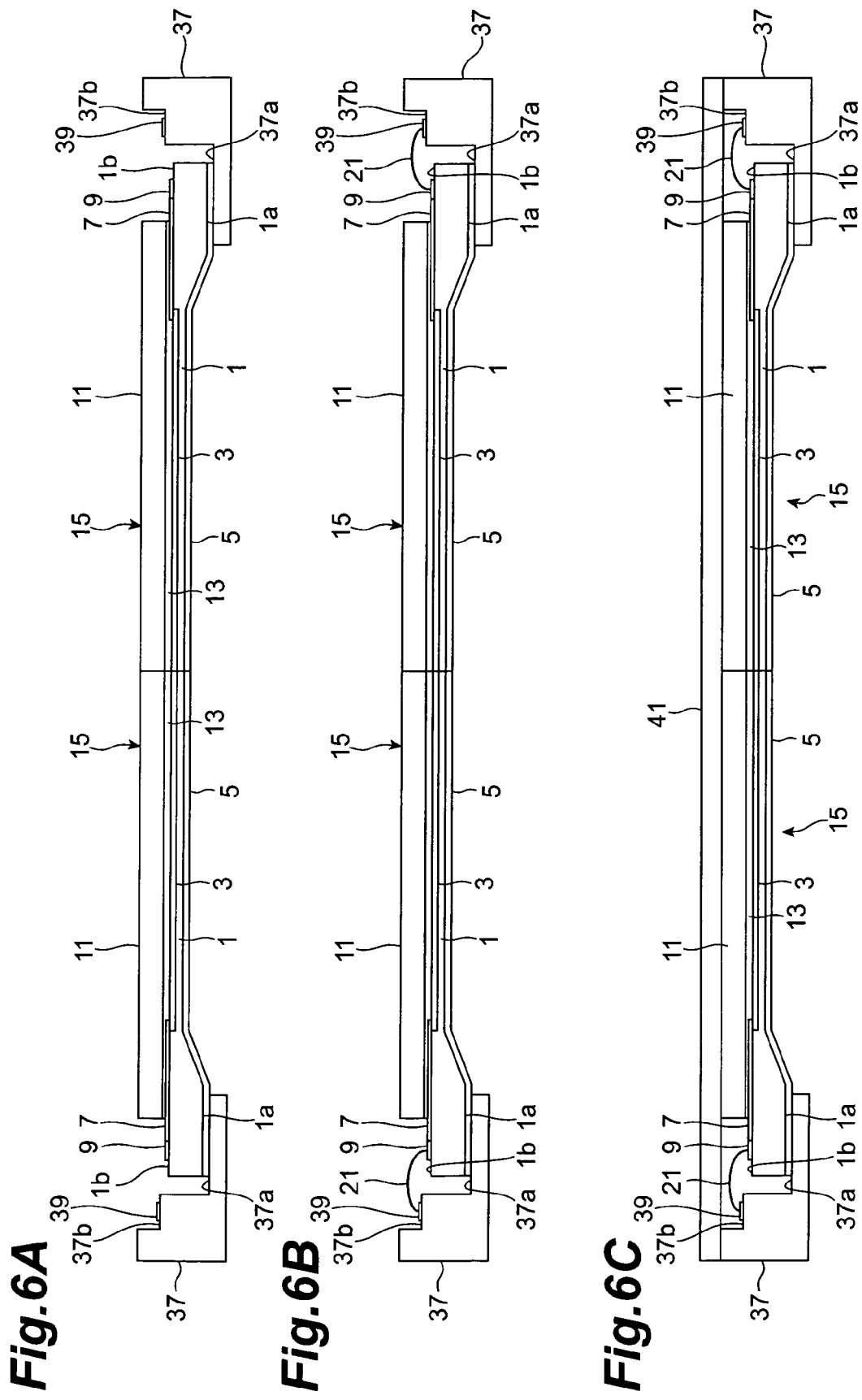
FIGS. 6A to 6C are schematic views for describing a back-illuminated photodetector manufacturing method for a third embodiment.
Figure 7:
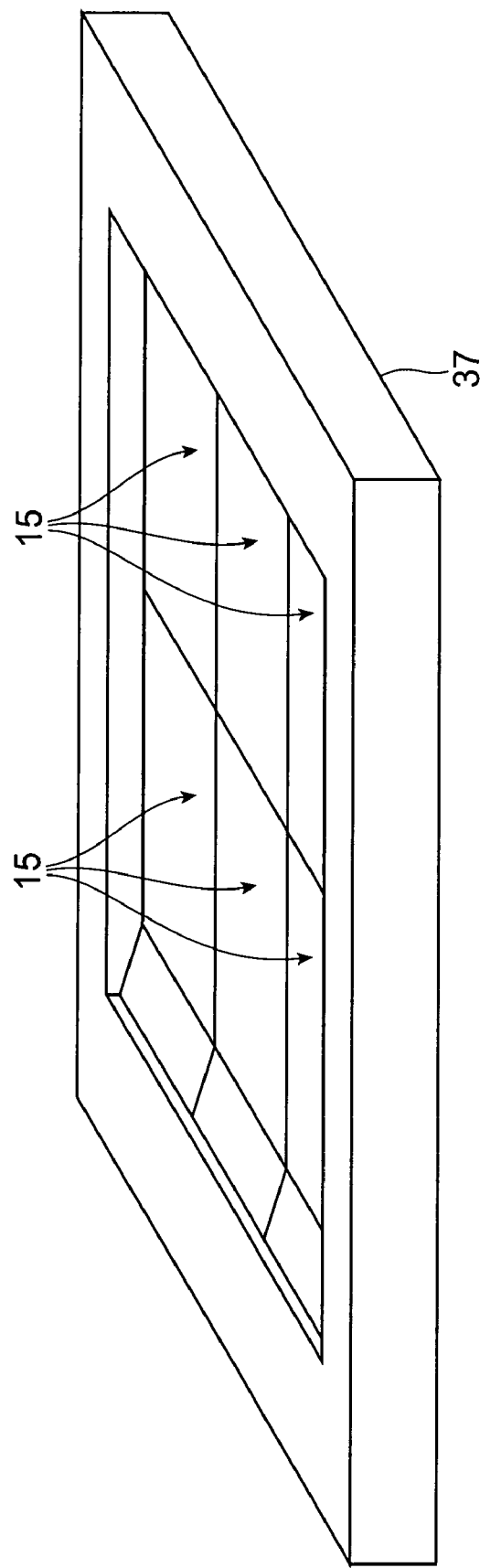
FIG. 7 is a schematic view for describing the back-illuminated photodetector manufacturing method for the third embodiment.

FIGS. 6A to 6C are schematic diagrams for describing a back-illuminated photodetector manufacturing method for a third embodiment and show the longitudinal sectional structure of a back-illuminated photodetector. FIG. 7 is a schematic diagram for describing the back-illuminated photodetector manufacturing method for the third embodiment and is a perspective view that includes a longitudinal section of the back-illuminated photodetector. A detailed description shall follow.

In the manufacturing method for the third embodiment, the following processes (1) through (9) are executed successively. However, processes (1) through (6) are the same as processes (1) through (6) of the above-described first embodiment and thus description thereof shall be omitted.

Process (7)

First, a package 37, onto which a plurality of CCD chips 15 are to be mounted, is prepared. The package 37 is formed to a rectangular, frame-like shape, comprises a chip mounting portion 37a and a step portion 37b, and has electrode pads 39 provided on step portion 37b. Ceramic, etc., may be used as the material of package 27.

CCD chips 15 are then positioned in a buttable configuration, and peripheral region 1a corresponding to region 1b at which electrical wiring 7 and electrode pad 9 are formed, of each CCD chip 15 is adhered onto CCD chip mounting portion 37a of package 37 to thereby fix each CCD chip 15 to package 37 (see FIG. 6A). The buttable configuration is formed by positioning the plurality of CCD chips 15 so that the thinned portions of semiconductor substrates 1 are positioned adjacent each other, that is, so that the cut surfaces of semiconductor substrates 1 and supporting substrates 11 abut each other. The adhesion of semiconductor substrates 1 and package 37 may be performed by die bonding using a resin (for example, an epoxy-based resin, etc.).

Process (8)

Electrode pads 39 of package 37 and electrode pads 9, formed on semiconductor substrates 1 of the respective CCD chips 15, are then electrically connected by bonding wires 21 (see FIG. 6B).

Process (9)

A protective plate 41 is then adhered onto supporting substrate 11 and package 37 so as to cover bonding wires 21 and both electrodes 9 and 39 (see FIG. 6C). Protective plate 41 is adhered by attaching to supporting substrates 11 and package 37 using a resin (for example, an epoxy resin, etc.). The plurality of CCD chips 15 are thereby mounted on package 37 (FIG. 7).

As described above, with the manufacturing method for the third embodiment, the manufacturing process is simplified and the manufacturing cost can be reduced as with the manufacturing methods of the first and second embodiments. Also, electrical wirings 7 and electrode pads 9 can be made fine readily.

The manufacturing method for the third embodiment furthermore has the processes of: preparing package 37, having electrode pads 39; and mounting the plurality of CCD chips 15 onto package 37; and the process of plural mounting onto package 37 comprises the processes of: positioning the plurality of CCD chips 15 so that the thinned portions of semiconductor substrates 1 are positioned adjacent each other and adhering peripheral regions 1a, corresponding to regions 1b at which electrical wirings 7 and electrode pads 9 are formed, respectively onto package 37; electrically connecting electrode pads 39 of package 37 and electrode pads 9, formed on semiconductor substrates 1, by bonding wires 21; and adhering protective plate 41 onto supporting substrates 11 and package 37 so as to cover both electrode pads 9 and 39 and bonding wires 21. The plurality of CCD chips 15 can thereby be mounted appropriately onto package 37. Also, the area of the photodetecting portions (CCD portions 3) of the back-illuminated photodetector can be made large readily. Since electrode wirings 7 and electrode pads 9 can be made fine as described above, the dead area that does not contribute to photodetecting will not become large.

FOURTH EMBODIMENT

Figure 9:
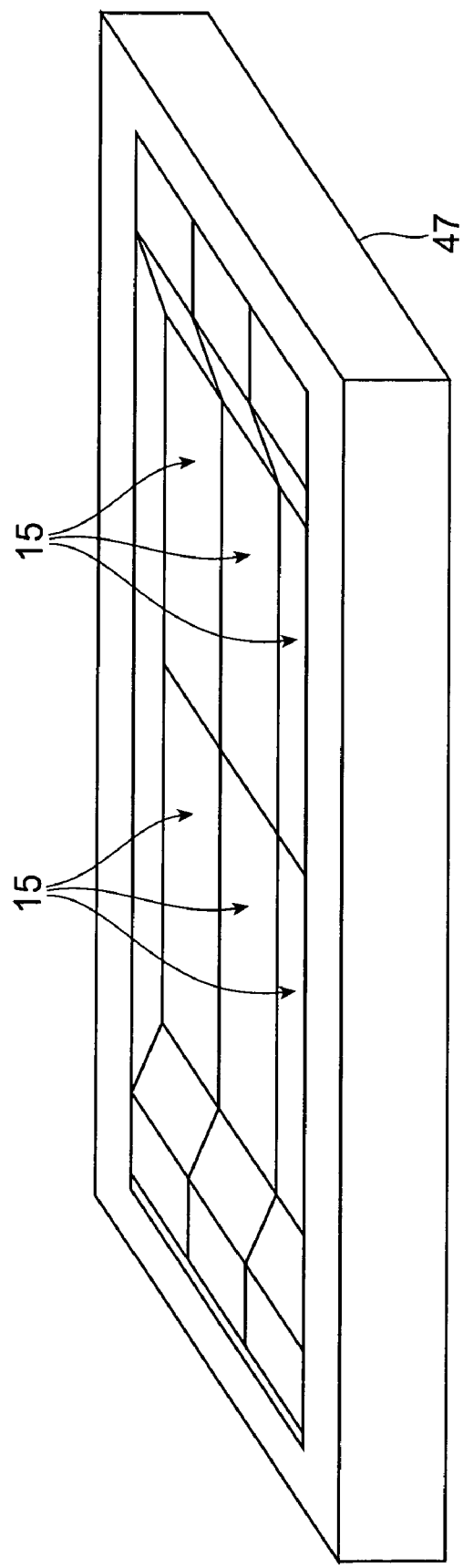
FIG. 9 is a schematic view for describing the back-illuminated photodetector manufacturing method for the fourth embodiment.

FIGS. 8A and 8B are schematic diagrams for describing a back-illuminated photodetector device manufacturing method for a fourth embodiment and show the longitudinal sectional structure of a back-illuminated photodetector. FIG. 9 is a schematic diagram for describing the back-illuminated photodetector manufacturing method for the fourth embodiment and is a perspective view that includes a longitudinal section of the back-illuminated photodetector. A detailed description shall follow.

In the manufacturing method for the fourth embodiment, the following processes (1) through (9) are executed successively. However, processes (1) through (6) are the same as processes (1) through (6) of the above-described first embodiment and thus description thereof shall be omitted.

Process (7)

First, a package 47, onto which a plurality of CCD chips 15 are to be mounted, is prepared. The package 47 comprises a CCD chip mounting portion 47a and a protruding portion 47b that is formed so as to oppose CCD chip mounting portion 47a, and has electrode pads 49 at the surface side of protruding portion 47b that opposes CCD chip mounting portion 47a. Openings 47c are formed at positions of CCD chip mounting portion 47a that oppose protruding portion 47b (electrode pads 49). Ceramic, etc., may be used as the material of package 47.

CCD chips 15 are then positioned in a buttable configuration, and supporting substrates 11 of the respective CCD chips 15 are adhered onto CCD chip mounting portion 47a of package 47 to thereby fix each CCD chip 15 to package 47 (see FIG. 8A). The buttable configuration is formed by positioning the plurality of CCD chips 15 so that the thinned portions of semiconductor substrates 1 are positioned adjacent each other, that is, so that the cut surfaces of semiconductor substrates 1 and supporting substrates 11 abut each other. The adhesion of supporting substrates 11 and package 47 may be performed by die bonding using a resin (for example, an epoxy-based resin, etc.).

Process (8)

Electrode pads 49 of package 47 and electrode pads 9, formed on semiconductor substrates 1, are then electrically connected by bonding wires 21 from openings 47c (see FIG. 8A).

Process (9)

A protective plate 51 is then adhered onto CCD chip mounting portion 47a of package 47 so as to close off openings 47c (see FIG. 8B). Protective plate 51 is adhered by attaching to package 47 using a resin (for example, an epoxy resin, etc.). The plurality of CCD chips 15 are thereby mounted on package 47 (see FIG. 9).

As described above, with the manufacturing method for the fourth embodiment, the manufacturing process is simplified and the manufacturing cost can be reduced as with the manufacturing methods of the first to third embodiments. Also, electrical wirings 7 and electrode pads 9 can be made fine readily.

The manufacturing method for the fourth embodiment furthermore has the processes of: preparing package 47, having electrode pads 49 and having openings 47c formed at positions corresponding to electrode pads 49; and mounting the plurality of CCD chips 15 onto package 47; and the process of plural mounting onto package 47 comprises the processes of: positioning the plurality of CCD chips 15 so that the thinned portions of semiconductor substrates 1 are positioned adjacent each other and adhering supporting substrates 11 respectively onto CCD chip mounting portion 47a of package 47; electrically connecting electrode pads 49 of package 47 and electrode pads 9, formed on semiconductor substrates 1, by bonding wires 21 from openings 47c; and adhering protective plate 51 onto package 47 so as to close off openings 47c. The plurality of CCD chips 15 can thereby be mounted appropriately onto package 47. Also, the area of the photodetecting portions (CCD portions 3) of the back-illuminated photodetector can thereby be made large readily. Since electrode wirings 7 and electrode pads 9 can be made fine as described above, the dead area that does not contribute to photodetecting will not become large.

INDUSTRIAL APPLICABILITY

The present invention can be applied to a Back-illuminated CCD image sensor, etc.

The invention claimed is:

1. A back-illuminated photodetector manufacturing method comprising the steps of:
    forming a charge reading portion at one surface side of a semiconductor substrate;
    thinning a region of the other surface side of the semiconductor substrate that corresponds to the charge reading portion while leaving regions peripheral to the region;
    forming an accumulation layer at the other surface side of the semiconductor substrate;
    forming, at a region of the one surface side of the semiconductor substrate corresponding to a the peripheral region, an electrical wiring, electrically connected to the charge reading portion, and an electrode pad, electrically connected to the electrical wiring;
    adhering a supporting substrate on the one surface side of the semiconductor substrate so as to cover the charge reading portion while leaving the electrode pad exposed; and
    cutting the semiconductor substrate and the supporting substrate at a thinned portion of the semiconductor substrate so as to leave the peripheral region corresponding to the region at which the electrical wiring and the electrode pad are formed.

2. The back-illuminated photodetector manufacturing method according to claim 1, further comprising the steps of:
    preparing a package having an electrode pad; and
    mounting the semiconductor substrate and the supporting substrate, which have been cut at the thinned portion of the semiconductor substrate onto the package; and wherein
    the step of mounting onto the package comprises the steps of:
    adhering the peripheral region corresponding to the region at which the electrical wiring and the electrode pad are formed, onto the package;
    electrically connecting the electrode pad of the package and the electrode pad formed on the semiconductor substrate by a bonding wire; and
    adhering a protective plate onto the supporting substrate and the package so as to cover the bonding wire and both the electrode pads.

3. The back-illuminated photodetector manufacturing method according to claim 1, further comprising the steps of:
    preparing a package having an electrode pad and having an opening formed at a position corresponding to the electrode pad; and
    mounting the semiconductor substrate and the supporting substrate, which have been cut at the thinned portion of the semiconductor substrate onto the package; and wherein
    the step of mounting onto the package comprises the steps of:
    adhering the supporting substrate onto the package to fix the semiconductor substrate and the supporting substrate, which have been cut at the thinned portion of the semiconductor substrate onto the package;
    electrically connecting the electrode pad of the package and the electrode pad formed on the semiconductor substrate by a bonding wire from the opening; and
    adhering a protective plate onto the package so as to close off the opening.

4. The back-illuminated photodetector manufacturing method according to claim 2 or 3, further comprising, after the step of mounting onto the package, the step of positioning a plurality of the packages, onto each of which the semiconductor substrate and the supporting substrate have been mounted, so that the thinned portions of the semiconductor substrates are positioned adjacent each other.

5. The back-illuminated photodetector manufacturing method according to claim 1, further comprising the steps of:
    preparing a package having electrode pads; and
    mounting a plurality of the semiconductor substrates and the supporting substrates, which have been cut at the thinned portions of the semiconductor substrates, onto the package; and wherein
    the step of plural mounting onto the package comprises the steps of:
    positioning the plurality of the semiconductor substrates and the supporting substrates, which have been cut at the thinned portions of the semiconductor substrates, so that the thinned portions of the semiconductor substrates are positioned adjacent each other and adhering the peripheral regions, corresponding to the regions at which the electrical wirings and the electrode pads are formed, respectively onto the package;
    electrically connecting the electrode pads of the package and the electrode pads, formed on the semiconductor substrates, by bonding wires; and
    adhering a protective plate onto the supporting substrates and the package so as to cover the bonding wires and both the electrode pads.

6. The back-illuminated photodetector manufacturing method according to claim 1, further comprising the steps of:
    preparing a package having electrode pads and having openings formed at positions corresponding to the electrode pads; and
    mounting a plurality of the semiconductor substrates and the supporting substrates, which have been cut at the thinned portions of the semiconductor substrates, onto the package; and wherein
    the step of plural mounting onto the package comprises the steps of:
    positioning the plurality of the semiconductor substrates and the supporting substrates, which have been cut at the thinned portions of the semiconductor substrates, so that the thinned portions of the semiconductor substrates are positioned adjacent each other and adhering the supporting substrates respectively onto the package;
    electrically connecting the electrode pads of the package and the electrode pads, formed on the semiconductor substrates, by bonding wires from the openings; and
    adhering a protective plate onto the package so as to close off the openings.

* * * * *